Figure 1:
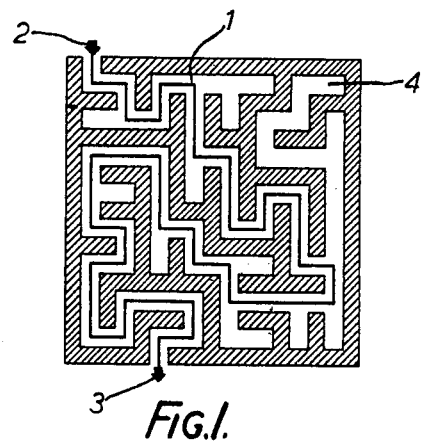

United States Patent [19]

Hutton et al.

[11] Patent Number: 4,718,017

[45] Date of Patent: Jan. 5, 1988

[54] METHOD OF PRODUCING A PATTERN-BEARING ARTICLE

[76] Inventors: Geoffrey Hutton; Robert Rostron, both of 42 Claremont Road, Surbiton, Surrey, BA1 6LX, Great Britain

[21] Appl. No.: 754,332

[22] PCT Filed: Oct. 29, 1984

[86] PCT No.: PCT/GB84/00364
§ 371 Date: Aug. 28, 1985
§ 102(e) Date: Aug. 28, 1985

[87] PCT Pub. No.: WO85/02043
PCT Pub. Date: May 9, 1985

[30] Foreign Application Priority Data

Oct. 28, 1983 [GB] United Kingdom ............... 8328909

[51] Int. Cl.⁴ .......................................... G06F 15/20
[52] U.S. Cl. .................... 364/470; 364/148; 364/491

[58] Field of Search ............... 364/468, 470, 488–491, 364/130, 148, 194, 300

[56] References Cited

U.S. PATENT DOCUMENTS

| 3,974,481 | 8/1976 | Ledieu et al. | 364/200 |
| 4,326,719 | 4/1982 | Tran et al. | 273/238 |
| 4,484,292 | 11/1984 | Hong et al. | 364/491 |
| 4,500,953 | 2/1985 | Smith et al. | 364/488 X |
| 4,608,649 | 8/1986 | Davis et al. | 364/490 X |

Primary Examiner—Joseph F. Ruggiero
Attorney, Agent, or Firm—Brisebois & Kruger

[57] ABSTRACT

A method is provided for the automatic generation of maze-like patterns for application to two-dimensional surfaces and three-dimensional objects. The directions of successive incremental steps of a continuous solution path through the maze are stored in an array and the data so stored is used to drive an output device which responds to the data in each cell of the array and in the neighbouring cells on two orthogonal sides thereof.

18 Claims, 5 Drawing Figures

| | | | | | | | | |
|---|---|---|---|---|---|---|---|---|
| 1 D | 2 R | 5 U | 6 R | 59 R | 70 R | 57 U | 58 R | |
| 63 L | 3 D | 4 R | 7 D | 60 D | 55 U | 56 R | 65 R | |
| 29 L | 28 L | 27 U | 8 D | 9 R | 54 L | 53 L | 52 U | |
| 30 D | 68 R | 26 U | 66 D | 10 D | 13 U | 14 R | 51 U | |
| 31 D | 32 R | 25 L | 24 U | 11 D | 12 R | 15 D | 50 U | |
| 34 L | 33 D | 69 D | 23 L | 22 U | 71 R | 16 D | 17 R | |
| 35 D | 38 U | 39 R | 40 R | 21 L | 20 L | 19 L | 18 D | |
| 36 D | 37 R | 42 L | 41 D | 61 D | 62 R | 64 D | 67 D | |
| | | | 43 D | | | | | |

Fig. 3a.

METHOD OF PRODUCING A PATTERN-BEARING ARTICLE

This invention relates to a method of producing an article bearing, embodying or otherwise displaying a maze-like pattern, and is applicable to a wide range of substances, including ceramic tiles, tiles of synthetic plastics material, textiles and the like. By "pattern" is meant any feature of colour, relief, surface texture, fretwork or the like. By "article" is meant any two-dimensional surface or three-dimensional object capable of bearing, embodying or otherwise displaying the pattern.

It is known that maze-like patterns may be used as a feature both of decoration and interest, and it is the object of the invention to improve the speed and efficiency of the production of master copy for the application of maze-like patterns to a wide range of substrates. In the past, mazes have been generated manually, with the attendant amount of manual labour. Also, in a manually-produced maze, it is not necessarily the case that the route through the maze is a random path, since the draftsman may unconsciously be working within a set of constraints which will introduce regular patterns or topological strategies into the design.

It has also been known to produce mazes by the application of computer programs, but on the one hand such programs as have been used take an exceedingly long time to produce even very small mazes, for example one program takes typically 30 minutes to generate a maze on a 10×10 grid. The general reason for this slowness is that the program re-starts whenever a forbidden condition arises, and the forbidden conditions include reaching an outer boundary of the maze before a sufficient pre-determined path length has been achieved, reaching a dead end from which there are no available exit paths, spiralling and, finally, crosssing a previously generated portion of the solution path. Any significant increase in the size of the maze greatly increases the chances that one or other of the forbidden conditions will arrise, and made the program impracticable for the realistic production of large mazes. Another problem is that the existing programs have been designed to generate displays on the monitor screen of the computer, and they are not suited to the production of maze-like patterns of conventional appearance.

The present invention is intended to overcome these problems, and permit the production of maze-like patterns of conventional appearance by an automatic process which results in random patterns in which each point on any of the pathways in the maze can be reached from any other such point.

According to the present invention, a method of manufacturing a pattern-bearing article includes the steps of:

(a) defining an array of locations,
(b) defining a starting location within the array,
(c) randomly or pseudo-randomly defining the directions of successive incremental steps of a continuous solution path extending from the said starting location to a finishing location and storing the said directions corresponding cells of the array, and
(d) driving an output device in response to the contents of cells of the array whereby a maze-like pattern is generated, each of the cells of which is configured as a result of testing the contents of a corresponding array cell and its neighbours on two orthogonal sides.

A minimum length will normally be set for the solution path. In order to fill the whole of the maze with paths, it is preferred, following step (c), (e) to fill the remaining available cells of the array with the directions of incremental steps of a number of blind paths generated by a process corresponding to that by which step (c) defines the solution path.

In setting up the array it is convenient to arrange that it is larger by two rows and two columns than the intended array. In such a case, initialisation of the array to values not used to define path direction can be used to ensure that the various paths defined in the array are confined within the intended size of the array. In step (d) the additional rows and columns are not utilised to drive the output device. During the performance of step (c) it is preferred at each step to test all adjacent array cells to determine whether the solution path is spiralling inwardly or is about to cross a previously defined portion of the path. Normally, the starting location will be defined at one edge of the maze, while the finishing location will be defined as that point on the opposite edge of the maze at which the solution path leaves the area of the maze. However, a pre-determined exit may be defined, and the solution path constructed from both ends until the two ends meet. Alternatively, the solution path may start and finish at points within the maze, leaving unbroken margins to the maze and, since each point on the maze paths is accessible from any other point, the entry and exit points may be defined, after the completion of steps (c) and (d), at any two discriminable points on the edge of the maze. This expedient is particularly useful in the production of ceramic tiling or the like, since a wide range of random maze-like patterns may be applied to the tiles, but provided the entry and exit points are suitably located along the edges of the tiles, they will be always capable of being matched together when laid to provide an extended, continuous maze. Yet another possibility is raised by the use of mazes with unbroken margins constructed in accordance with the invention. Because of the intercommunication of all parts of the maze path, a series of individual mazes based on the same grid but with different individual pattens can be stacked vertically and linked by perforations perpendicular to the planes of the individual mazes to provide a three-dimensional maze. By casting the individual mazes in clear synthetic resin, for example polymethyl methacrylate, with the pattern forming channels in a flat plate, a set of mazes can be stacked together with a perforation linking each maze with an adjacent maze, and closed by plain end plates, to provide a three-dimensional maze. Starting and finishing points can be marked on the maze so formed, and the maze can be traced by a ball bearing placed in the maze before securing the end plates.

In addition to the production of the maze-like pattern, the process of the invention can also be used to produce a solution to the maze on the basis of the contents of the array. This can be done either by producing a list of the directions of the successive steps on the solution path, or alternatively a small version of the maze, with the solution path marked in, can be produced.

Figure 3B:
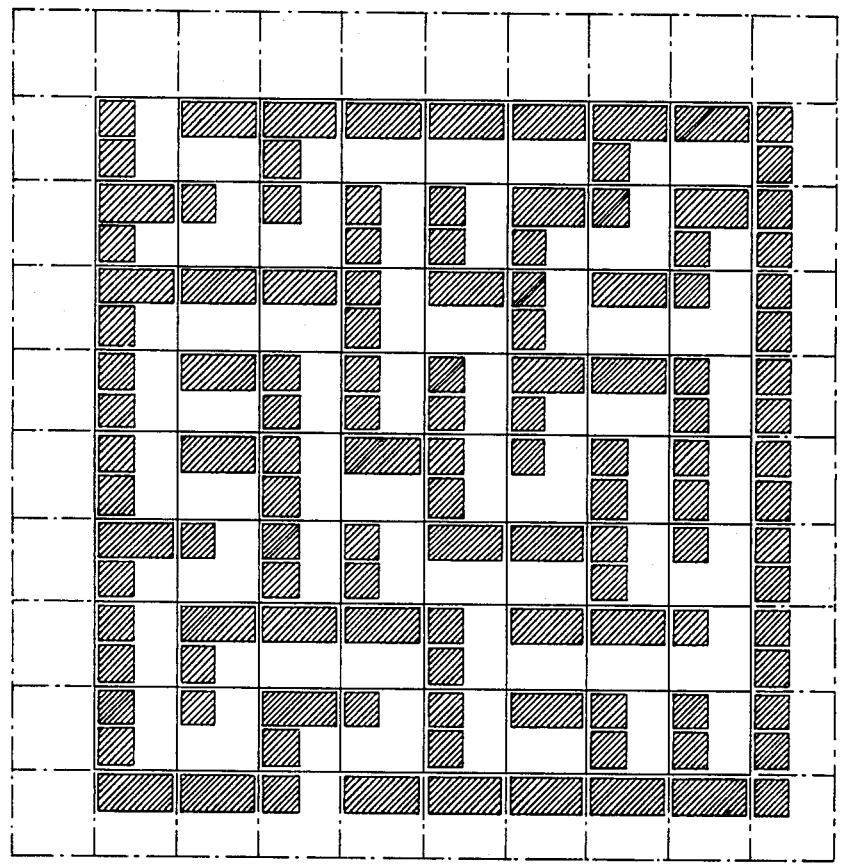

It is obviously possible to implement much of the process on a computer, and this option will be described below. However, the novelty of the method lies in the steps set out above, and does not reside in any program or algorithm per se The invention will now be explained in greater detail with reference to the accompanying drawings, of which FIG. 1 is a maze-like pattern of the kind with which the invention is concerned, FIG. 2a is a schematic representation of the operation of steps (a), (b), (c) and (e) of the invention, FIG. 2b is a schematic representation of the operation of step (d) of the invention, FIG. 3a is a view of the array of the invention, corresponding to FIG. 1, and FIG. 3b is a detailed view of the maze corresponding to the array contents shown in FIG. 3a.

FIG. 1 shows the type of maze-like pattern to which the invention applies. It consists of a solution path identified by the trace 1 which extends from a starting point 2 to a finishing point 3, and a number of blind paths such as that indicated at 4. The illustrated maze can be regarded as an 8×8 array of cells plus a right-hand and lower border, in which each cell is traversed by a path, and is accessible from any other cell. The maze can be of any extent and, as indicated above, it may have any desired arrangement of entrance and exit cells around its edges, or have no such cells at all. It will be observed that the paths of the maze illustrated in the Figure do not cross or otherwise form closed loops. Thus the solution path is unique.

Figure 2A:
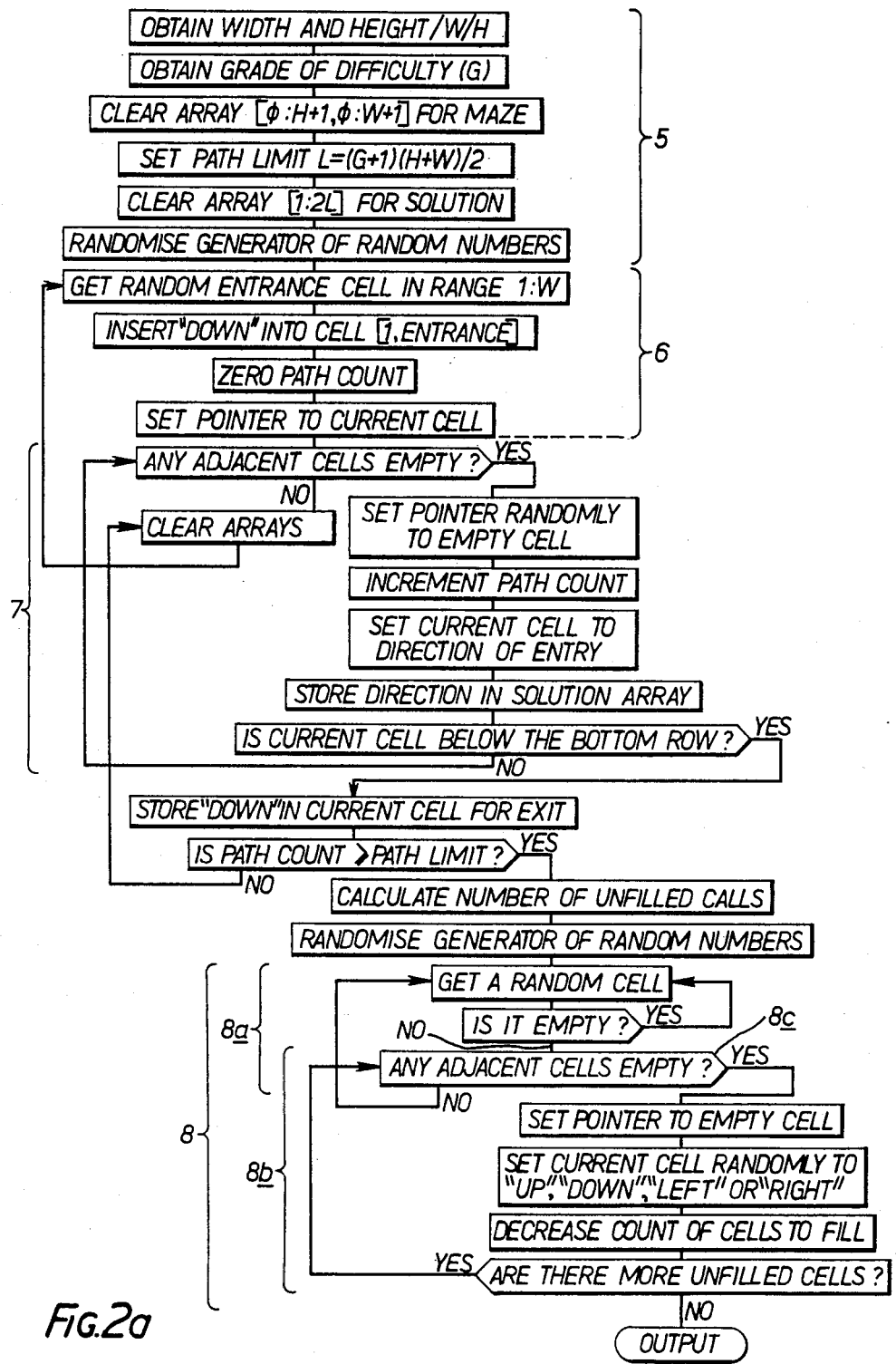
Figure 2B:
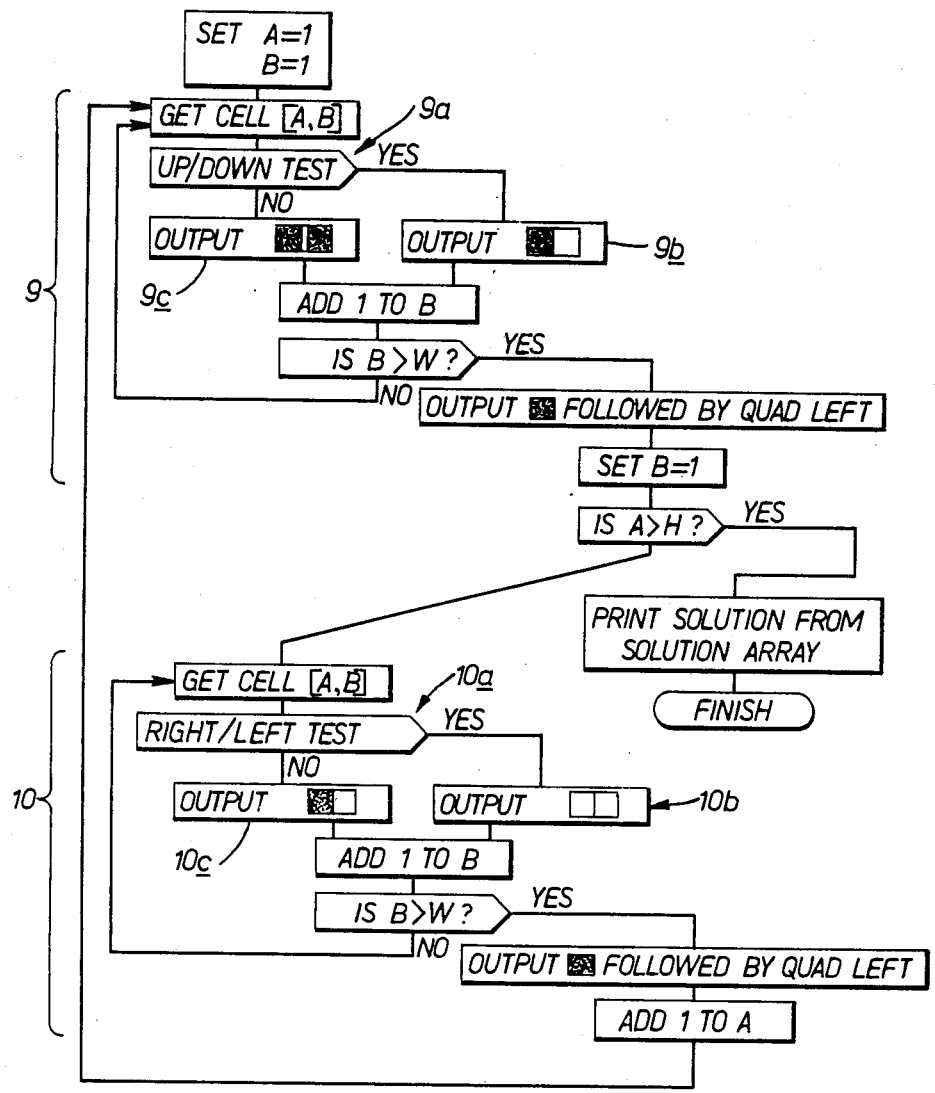

The process by which the maze of FIG. 1 was produced falls into two main parts, which are illustrated by the two flowcharts in FIG. 2a and 2b respectively. Starting with FIG. 2a, a number of preliminary steps of the process are identified collectively at 5. Individual steps in the flowcharts will not be identified individually by numbers where their function is clear from the description. Firstly the overall size of the finished maze is defined by its width W and height H, which are expressed in terms of numbers of cells of the maze, and the degree of difficulty of the maze is defined by a numerical factor G. A 'maze array' of storage locations is then established and set to zeros, the number of rows and columns in each case being greater by two than the corresponding dimension, expressed in terms of cells, of the maze. A minimum length L for the solution path is then calculated according to the formula:

$$L=(G+1)(H+W)/2$$

and a second array with 2L cells is established and set to zeros to store details of the solution path as it is generated. Finally, the initial state of a random number generator is itself set randomly.

The generation of the solution path now proceeds. A starting position for the solution path is defined as a cell in row 1 of the maze array, the precise cell selected being determined in response to the functioning of the random number generator. It will be noted that the top row of the maze array is defined as row 0, so the starting position is located in the second row of the maze array. The direction DOWN is then stored in the starting cell, and at this stage a path length counter is set to zero, and the position of the starting cell is recorded as the "current cell". This initial generation of the starting point of the solution path is carried out by the steps identified at 6 in FIG. 2a. Having defined the starting point, the process now enters a cyclic stage indicated by the steps identified at 7 in FIG. 2a. The first step of the cyclic process determines whether any cell in the maze array adjacent to the current cell is empty. If, at any stage during the generation of the solution path, this test is not fulfilled, the whole generation of the path is re-started from the beginning of the sequence of steps 6. At the first traverse of steps 7, the test will in any case give a "true" result. In the general case the pointer is set randomly to an available cell above, below or to the left or right of the current cell, and the path is incremental by 1 to maintain a record of the path length. The cell to which the pointer now points then becomes the current cell, and the direction of entry of the solution path into this new current cell is stored in the cell and in the solution array. This process is repeated until the current cell is one which is located in the bottom row of thw maze array, and thus corresponds to a position below the bottom row of the eventual maze.

When control exits from the cyclic steps 7, the direction "DOWN" is placed into the current cell, to provide an exit from the maze, and the path count is tested against the minimum solution path length L which has already been calculated. If the path count is less than the minimum solution path length, the process returns via the array clearance located among steps 7 to re-start the plotting of the solution path through the maze arrray. Assuming that the path-length test is satisfied, the next operation to be carried out is the filling of the hitherto vacant cells of the maze array with random, blind paths. The production of these paths is generally analogous to that of the solution path, but for obvious reasons the built-in re-start from a situation in which no cells adjacent to the current cell are empty is not provided, since the precise intention is to generate blind paths. As a preliminary step, the number of unfilled cells in the maze array is calculated as the difference between the total size of the array and the recorded solution path length, and the result stored. To ensure continuing randomness, the state of the random number generator is itself randomised, and a cyclic series of steps, generally indicated at 8, is entered. The series 8 is composed of two separate sub-series 8a and 8b, each of which is itself cyclic, and which share a common step 8c. The series 8a operates to find random cells of the maze array which are located on existing paths, and which have at least one empty contiguous cell. When such a cell has been detected and made current, the pointer is transferred to the or, randomly, one of the, empty contiguous cells, and that cell is filled with the direction of entry from the previously current cell to the current cell. The count of unfilled cells is decremented by 1 and if unfilled cells are found to remain, an attempt is made, via a return to step 8c, to continue the blind path currently under construction. If, however, no empty cells are contiguous to the current cell, control returns to the first step of 8a and another available cell is sought. This part of the process continues until all the cells in the maze array are filled. The output from the process therefore consists of two arrays; firstly the maze array, and secondly the solution array, which contains a record of the successive cell-by-cell movements defined by the solution path itself.

The process by which the output from FIG. 2a is manipulated to form a maze-like pattern is shown diagrammatically in FIG. 2b, which is set out in terms of a photo-typesetting operation. To aid in the understanding of this Figure, reference will first be made to FIGS. 3a and 3b. FIG. 3a represents the maze array corresponding to FIG. 1, and produced by the process of FIG. 2a, in which the edges are formed by marginal, zero-filled cells. Each cell on the solution path is identified by the numerical sequence in which it was added to the path, while the cells in the blind paths in the array are numbered upwardly from 50. The cells also contain the letters U (=up), D (=down), L (=left) or R (=right), depending upon the direction of entry of a path into the cell. Clearly, the actual symbols stored in the array may be in some other representation, depending upon the equipment used and the method of use adopted.

Generation of the maze pattern involves scanning of the rows of the maze array and generating, for each row, two rows of graphical pattern untis which depend upon the contents of each cell in the row of the array and the contents of certain neighbouring cells. The way in which the neighbouring cells will be utilised will depend upon the direction of scanning, but in the present case it will be assumed that this takes place from left to right along successive rows of the maze array, the rows being processed from top to bottom of the maze array shown in FIG. 3a. It will be recalled that in the process of FIG. 2a, the starting row and column of the maze array were allocated the subscript 0, and that the overall dimensions of the maze array were greater by two than the eventual maze pattern. FIG. 2b begins the manipulation of the contents of the maze array output of FIG. 2a by setting the row and column subscripts both to 1, which excludes the top row and leftmost column from the scanning process. The first row of graphical pattern units derived from anay given row of the maze array is generated by a series of steps identified generally at 9. It will be seen that this series of steps refers successively to all the cells in the given row by incrementing the array subscript B until the incremented subscript exceeds the intended width of the array. The test by which the pattern unit corresponding to each cell is decided (9a) is:

'does the array cell immediately above the present cell contain the information "U" or is the content of the present cell "D"?'

Alternatively stated, this becomes, for any cell (A, B) in the maze array:

CELL(A−1, B)='U'.OR. CELL(A, B)='D'

If the condition is fulfilled, then the graphical pattern indicated in step 9b is generated, otherwise that in step 9c. When the incremented value of B exceeds the maze width W, a single black square is added to the right-hand end of the row of graphical pattern units just generated, and the typesetter is reset by the maze width and the depth of one row of graphical symbols. The column subscript B is re-set to 1, and, provided that the subscript A is still within range, a second row of graphical symbols is generated by the steps generally indicated at 10. This part of the process is generally analogous to that of the steps 9, but in this case the test 10a may be expressed as:

'does the array cell immediately to the left of the present cell contain the information "L", or is the content of the present cell "R"?'

Alternatively, in logical notation:

CELL(A, B−1)='L'.OR. CELL(A,B)='R'

The graphical patterns corresponding to the outcome of the test are shown in steps 10b and 10c. When the second row of graphical patterns is complete, the generation of a final right-hand black square and re-setting of the typesetter is again carried out, the row subscript A is incremented, and control returns to steps 9 for processing of the next row of the maze array. FIG. 3b shows the results of this process when applied to the maze array of FIG. 3a. For clarity, small gaps have been left in the rows of graphical pattern units, but these would not normally appear. Comparison of FIGS. 3a and 3b will illustrate the way in which the graphical pattern units in each pair of pattern rows correspond to the contents of the respective row of the maze array. It will also be observed that the test following steps 9 prevents the generation of a second row of pattern units from the bottom row of the maze array.

When the maze pattern has been plotted, the contents of the solution array are then printed to provide a solution to the maze, for example as a string of the letters "U", "D", "L" and "R", or as arrows pointing in the corresponding directions. Alternatively, a small version of the maze can be produced, with the solution path traced by a line whose course is defined by the contents of the solution path array.

It will be understood that the specific example described above illustrates only one method of putting the present invention into practice. However, it is to be stressed that the general technique makes the generation of maze-like pattens into a practical proposition, since the speed of operation becomes acceptable and the generation of typesetting commands provides a novel means of generating master copy of the maze-like patterns. These masters can then be used to manufacture a wide range of articles bearing the pattern. To indicate the speed of the process, a complete maze array of 64×64 cells could be output by the process illustrated in FIG. 2a in times of from thirty seconds to fifteen minutes, the precise time depending upon the number of re-starts. This contrasts, as will be recalled, with a time of thirty minutes taken by the prior art to plot a maze of only 10×10 cells.

We claim:

1. A method of producing a maze-like pattern, said method comprising the steps of,
   a. defining an array of location,
   b. defining a starting location within the array,
   c. randomly or pseudo-randomly defining the directions of successive incremental steps of a continuous solution path extending from said starting location, and storing said directions in corresponding cells of the array,
   d. driving an output device in response to the contents of cells of the array whereby a maze-like pattern is generated, each of the cells of which is configured as a result of testing the contents of a corresponding array cell and its neighbours on two orthogonal sides.

2. A method according to claim 1 wherein said method comprises producing said maze-like pattern on an article.

3. A method according to claim 1 wherein said method comprises producing said maze-like pattern on a set of articles.

4. A method according to claim 1 wherein said method comprises producing different maze-like patterns on a set of articles adapted to be assembled together to provide a three-dimensional maze-like pattern.

5. A method according to claim 4 wherein said three dimensional maze-like pattern is formed by removing material from adjacent ones of the assembled articles to form a maze-like cavity.

6. A method according to claim 5 further comprising positioning a tracking body in the maze-like cavity for movement therein in response to tilting the assembled articles.

7. A method according to claim 1 in which a minimum length is set for the solution path.

8. A method according to claim 1 wherein after step c. the following step is performed:
   e. fill the remaining available cells of the array with the directions of incremental steps of a number of blind paths generated by a process corresponding to that by which step c. defines the solution path.

9. A method according to claim 1 in which the array is larger by two rows and two columns than the minimum size of array necessary to accommodate the data required for the formation of the maze-like pattern.

10. A method according to claim 9 in which at least the outermost cells of the array are initialised to values not used to define directions.

11. A method according to claim 10 in which all the cells of the array are initialised to values not used to define directions.

12. A method according to claim 1 in which during the performance of step c. the contents of all cells adjacent to a cell currently being tested are themselves tested to determine whether the solution path defined by the directions so far determined is spiralling inwardly or about to cross a previously-defined portion of the path.

13. A method according to claim 1 in which the starting location of the solution path is pre-defined at a fixed position on one edge of the maze.

14. A method according to claim 13 in which the finishing location is defined as the point at which the solution path leaves the area of the maze at the edge opposite to the said one edge.

15. a method according to claim 13 in which the finishing location is pre-defined at a point on the perimeter of the maze spaced apart from the starting location and the construction of the solution path is carried out from both ends until the two parts of the path meet within the area of the maze.

16. A method according to claim 1 in which at least one end of the solution path is located within the maze, and a marginal cell chosen subsequently to completion of step c. to provide the entry or exit to of from the maze.

17. A method according to claim 1 in which the process also produces a solution to the maze on the basis of the contents of the array.

18. A method according to claim 17 in which the solution is formed as a second maze-like pattern on the article or a second article with the solution path graphically identified.

* * * * *